(12) United States Patent
Kundner et al.

(10) Patent No.: US 7,965,081 B2
(45) Date of Patent: Jun. 21, 2011

(54) ARRANGEMENT AND SUPPORT DEVICE FOR ATTACHING LOCAL COILS IN A MAGNETIC RESONANCE APPARATUS

(75) Inventors: Thomas Kundner, Buckenhof (DE); Nikolas Schemmel, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 532 days.

(21) Appl. No.: 12/167,359

(22) Filed: Jul. 3, 2008

(65) Prior Publication Data
US 2009/0012389 A1 Jan. 8, 2009

(30) Foreign Application Priority Data
Jul. 5, 2007 (DE) .................. 10 2007 031 345

(51) Int. Cl.
*G01V 3/00* (2006.01)
(52) U.S. Cl. ......................... 324/318; 324/309
(58) Field of Classification Search .......... 324/300–322; 600/407–445
See application file for complete search history.

(56) References Cited

U.S. PATENT DOCUMENTS

| | | | | |
|---|---|---|---|---|
| 4,791,372 A | * | 12/1988 | Kirk et al. ............ | 324/318 |
| 5,143,068 A | * | 9/1992 | Muennemann et al. ...... | 600/422 |
| 5,305,750 A | * | 4/1994 | Makita ............ | 600/415 |
| 5,343,862 A | * | 9/1994 | Jones ............ | 600/422 |
| 5,379,768 A | * | 1/1995 | Smalen ............ | 600/410 |
| 5,400,787 A | * | 3/1995 | Marandos ............ | 600/422 |
| 5,945,827 A | * | 8/1999 | Gronauer et al. ........... | 324/318 |
| 6,518,762 B2 | * | 2/2003 | Van De Spijker ............ | 324/318 |
| 6,882,878 B2 | * | 4/2005 | Schmit et al. ........... | 600/415 |
| 7,450,985 B2 | * | 11/2008 | Meloy ............ | 600/422 |
| 2002/0079898 A1 | | 6/2002 | Van De Spijker | |
| 2006/0173390 A1 | * | 8/2006 | Van Wyk et al. ........... | 602/6 |

FOREIGN PATENT DOCUMENTS

WO WO 2005/124380 12/2005

* cited by examiner

*Primary Examiner* — Brij B Shrivastav

(74) *Attorney, Agent, or Firm* — Schiff Hardin LLP

(57) ABSTRACT

An arrangement and a support device for attaching local coils to a patient for a magnetic resonance examination includes at least one local coil that is designed to acquire magnetic resonance signals and a support device. The support device is designed to accommodate the at least one local coil and to attach the at least one local coil on the patient. The support device is designed as a gas-filled cushion that changes its shape dependent on the gas pressure therein. The gas-filled cushion has a device for changing the gas pressure, such when a gas pressure change occurs the local antenna is pressed on the patient due to the resulting change in shape of the cushion.

26 Claims, 7 Drawing Sheets

ARRANGEMENT AND SUPPORT DEVICE FOR ATTACHING LOCAL COILS IN A MAGNETIC RESONANCE APPARATUS

BACKGROUND OF THE INVENTION

1. Field of the Invention

The present invention concerns an arrangement and a support device for attaching local coils to the anatomy of a patient.

2. Description of the Prior Art

In magnetic resonance examinations, local coils are used to acquire magnetic signals. In order to obtain a good signal-to-noise ratio (SNR), the local coils are attached on the patient optimally close to the region to be examined. Flexibly designed local coils have proven to be useful. These are known as "flexcoils" and, due to their flexibility, allow an adaptation of the local coil to the anatomy or body shape of the patient.

These flexible local coils are generally fixed on the patient with tension belts with relatively large effort. For example, multiple local coils must be attached on the patient with precise positioning for measurements of the chest.

The employed tension belts are relatively unwieldy in comparison to the local coils and constrict the patient during the examination.

After the coils and belts have been placed on the patient, a subsequent change of the position and/or the number of the employed local coils is not possible, or is possible only with great effort due to the necessity of unfastening and refastening the local coils.

To examine various body regions, due to respective different body shapes, it is necessary to provide a number of appropriately designed or shaped local coils.

SUMMARY OF THE INVENTION

An object of the present invention is to provide an arrangement and a support device for attachment of local coils on a patient that enables an examination with less effort and with a reduced spatial constriction of the patient.

The arrangement according to the invention for attaching local coils to a patient for a magnetic resonance examination has at least one local coil that is designed to acquire magnetic resonance signals, and a support device that is designed to accommodate the at least one local coil and to attach the at least one local coil on the patient.

The support device is designed as a gas-filled cushion that changes its shape dependent on the gas pressure supplied thereto. The cushion has a device for changing (modifying) the gas pressure. When a gas pressure change occurs the local antenna is pressed on the patient due to the shape change of the cushion.

In an advantageous embodiment, normal environmental or breathing air is used as the gas. By pumping out the air via a valve, the local coil is molded to the body of the patient due to the shape change of the cushion.

A degree of molding or a molding pressure is set by the vacuum that arises upon pumping out the air. A feeling of spatial constriction in the patient thus can be avoided with small effort by controlling the pumping-out process.

In an embodiment, local coils used for examination are flexibly designed, comparable to the known "flexcoils". A further optimization of the molding of the local coils to the patient is thereby achieved.

In an embodiment, the local coils are integrated parts of the cushion.

As an alternative, the cushion can have pocket-shaped recesses into which the local coils can be inserted. In this case the local coils can be subsequently varied in terms of their number or, respectively, position on the body of the patient.

As another alternative to this it is possible, for example, to attach the local coils at nearly any point of the cushion with the use of hook-and-loop fasteners.

A subsequent selection of body parts to be examined is enabled by the possibility of the subsequent reapplication of local coils on the body.

In a preferred embodiment the cushion is fashioned with the local coils as a fixed component of the magnetic resonance apparatus. For example, a unit formed by the cushion and local coils can be designed as a mat. Upon insertion of the patient lying on a transport platform into the magnetic resonance apparatus, the mat of the unit descends onto the patient. A molding of the mat to the body of the patient is achieved by evacuating the air.

An automatic and anatomically exact adaptation of local coils to a number of differently-sized patients can be achieved with the arrangement according to the invention.

With the use of the arrangement according to the invention it is possible to examine body regions of different patients with only one cushion-coil unit. Considerable procurement costs for differently shaped local coils thus can be reduced.

The patient throughput is advantageously increased and the previously required patient preparation time is minimized due to the simple handling at the magnetic resonance apparatus that is achieved with the inventive arrangement.

Depending on the achievable shape of the cushion, it is possible to examine different body regions of a patient with only one cushion-local coil unit. For example, in addition to the upper body of a patient it is possible to also examine the patient's legs.

DESCRIPTION OF THE PREFERRED EMBODIMENTS

Figure 1:
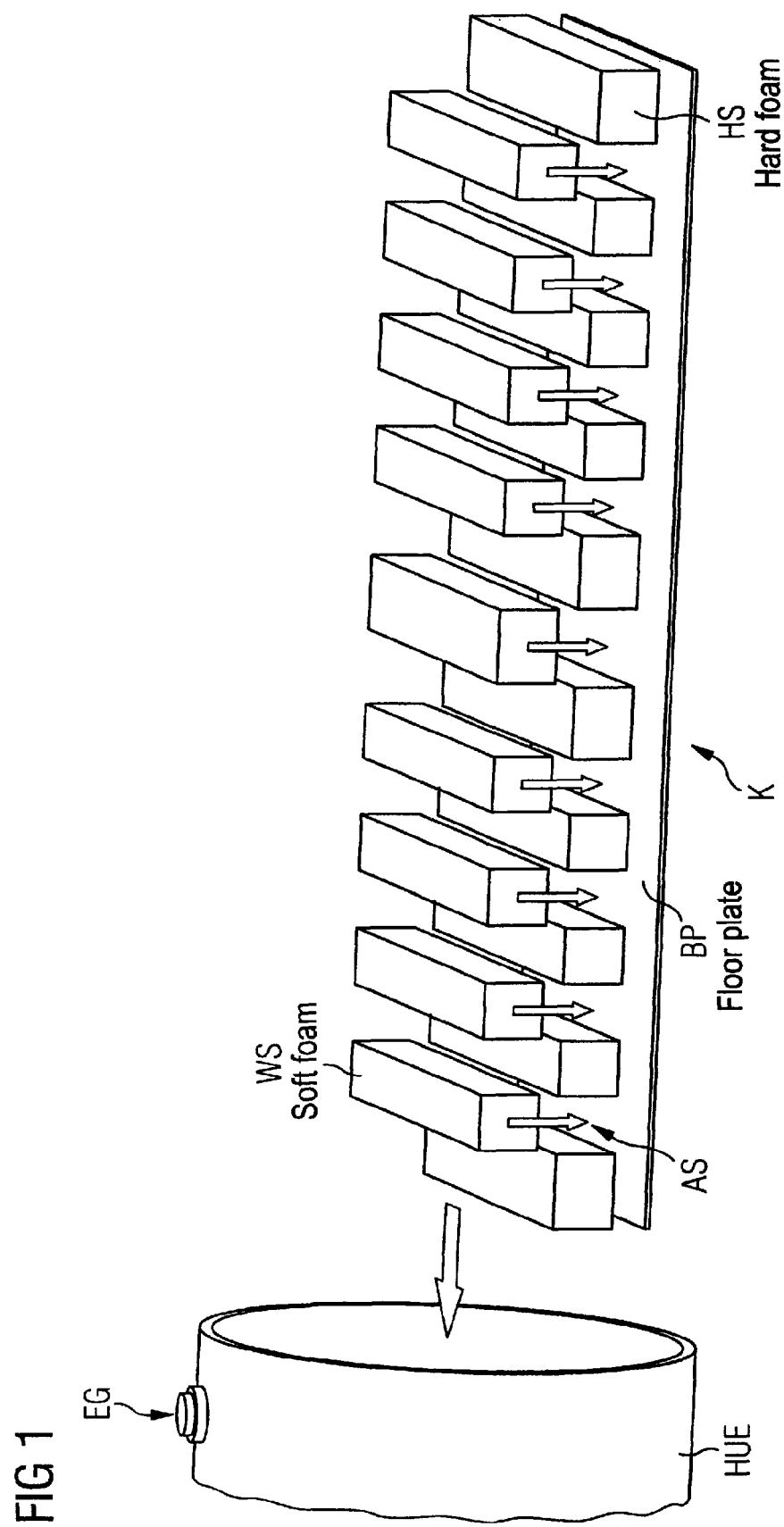
FIG. 1 subsequently illustrates a basic, exemplary embodiment of the cushion of the arrangement according to the invention.

FIG. 1 shows a basic, exemplary embodiment of a cushion K of an arrangement according to the invention.

The cushion K has a base plate BP that, for example, is formed as a flexible plastic plate. A layer of air-impermeable hard foam HS is applied on the base plate BP by an adhesive bond, for example.

The air-impermeable hard foam HS exhibits recesses AS in which an air-permeable soft foam WS can be arranged in bands. For example, longitudinal bands are cut or punched out from the air-impermeable hard foam HS in order to form the recesses AS.

The recesses AS are filled with the air-permeable soft foam WS.

Due to the design composed of the base plate BP, the soft foam WS and the hard foam HS, a plate is formed that is slid into an air-impermeable casing HUE, made for example from polyvinylchloride. The casing HUE is cemented to be airtight after the insertion of the plate.

The casing HUE has a valve or a tube connected to the casing HUE as a device to change gas pressure EG in order to be able to pump air out from the casing HUE.

With the plate BP and the valve or tube, the casing HUE forms the overall cushion K according to the invention. The cushion K is fashioned as a support for at least one local coil (not shown) of the type used to implement magnetic resonance examinations (magnetic resonance data acquisition).

Figure 2:
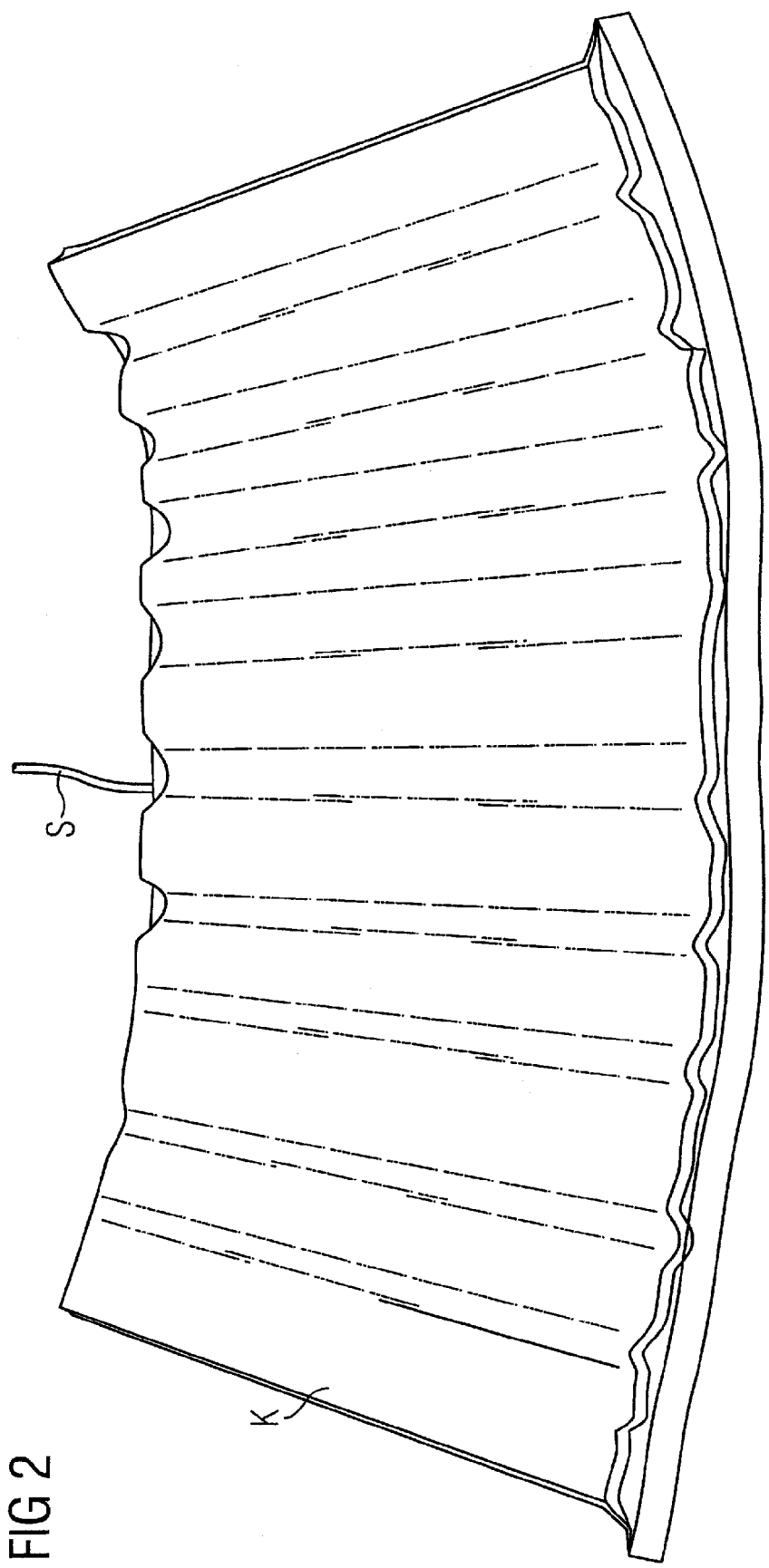
FIG. 2 through FIG. 7 respectively show shape changes of the cushion that are achievable according to the invention.

FIG. 2 shows a normal state of the cushion K. For example, the cushion K is straight and plate-shaped when normal environmental air pressure prevails inside it. If air is now suctioned from the cushion K via a tube S, the cushion begins to curve upward in stages (see FIG. 3 and FIG. 4).

This curvature ensues because (relative to FIG. 1) the air-permeable soft foam WS uniformly contracts upon pumping out the air while the air-impermeable hard foam HS adhered to the base plate BP remains dimensionally stable and therefore experiences no contraction.

The air-permeable soft foam WS contracts at opposite sides of the base plate BP and thereby forces a shorter distance between the bands of hard foam HS. A force therefore arises that causes the curvature of the base plate BP and therefore the shape change of the entire cushion K.

The shape change is dependent on the magnitude of the set negative pressure in the cushion K.

The integration of the cushion K described above with associated local coil as a unit in a magnetic resonance apparatus is more easily achievable due to the independent, pressure-dependent shape change of the cushion K.

In a form comparable to that shown in FIG. 2, the cushion K is lowered onto the patient as a mat and is subsequently molded to the patient by appropriate pressure control until the patient is enclosed in a half-circle (for example), comparable to the shape shown in FIG. 3.

Figure 5:
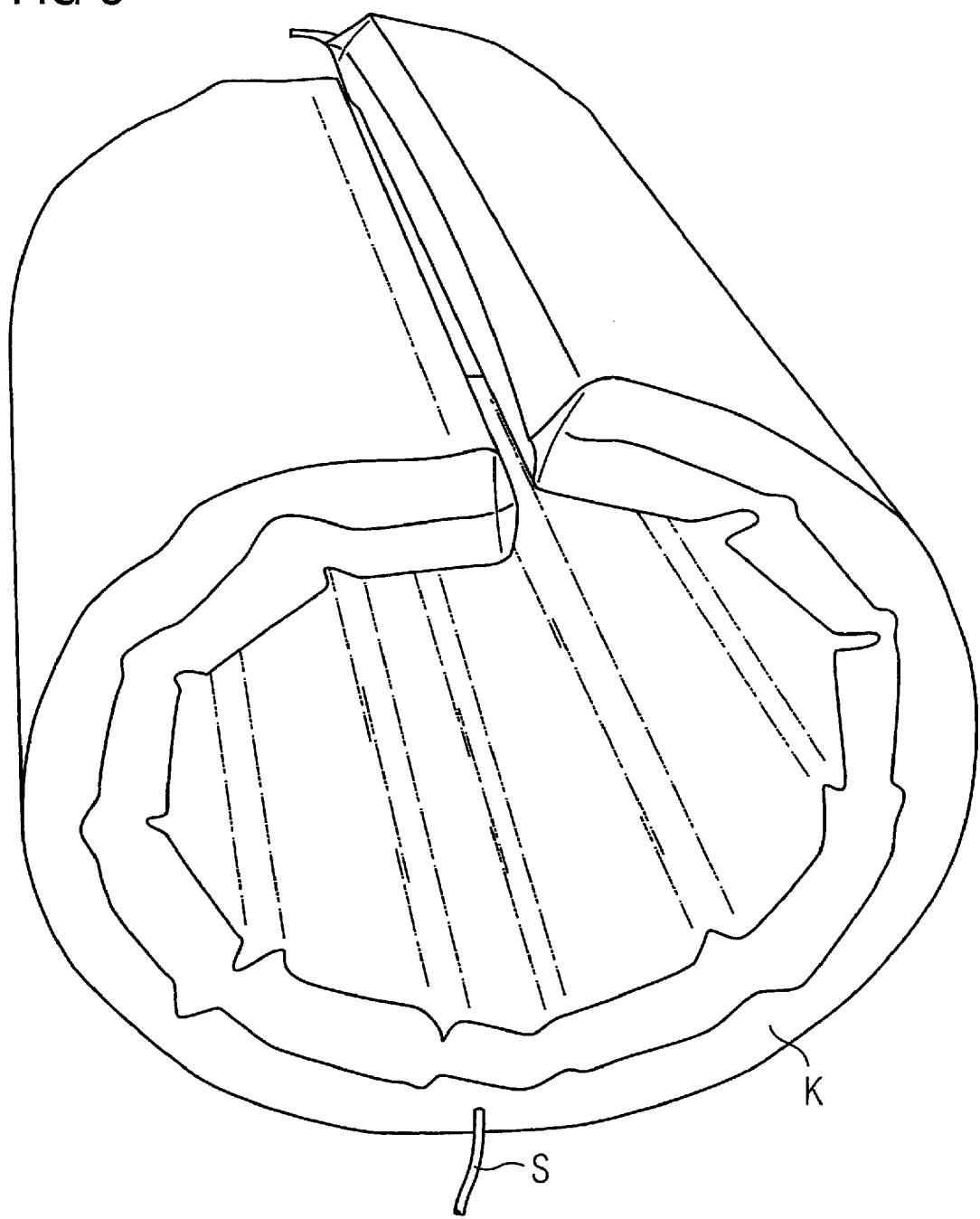

FIG. 5 shows the cushion K that is configured to have a nearly circular cross-section.

Figure 6:
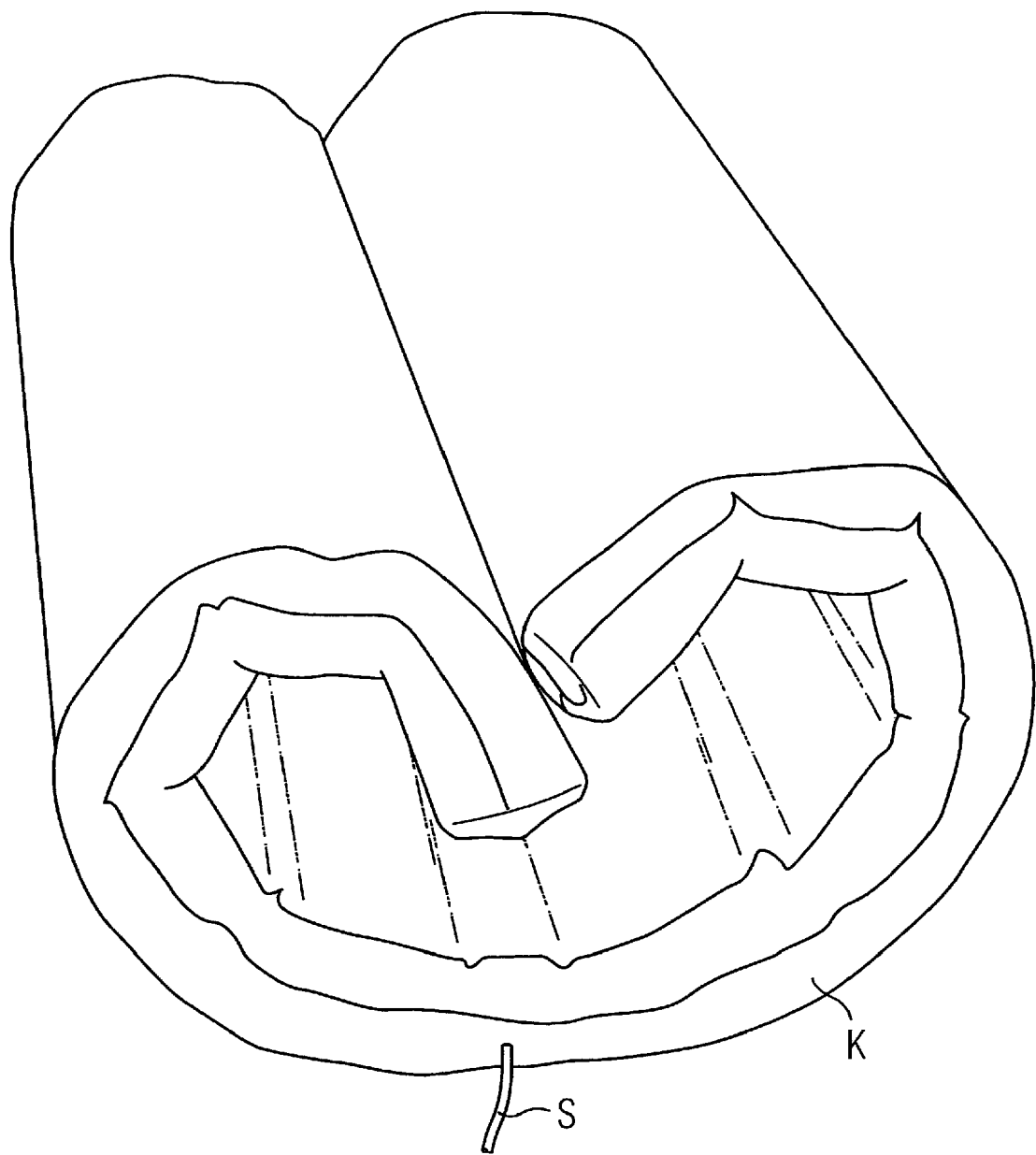
Figure 7:
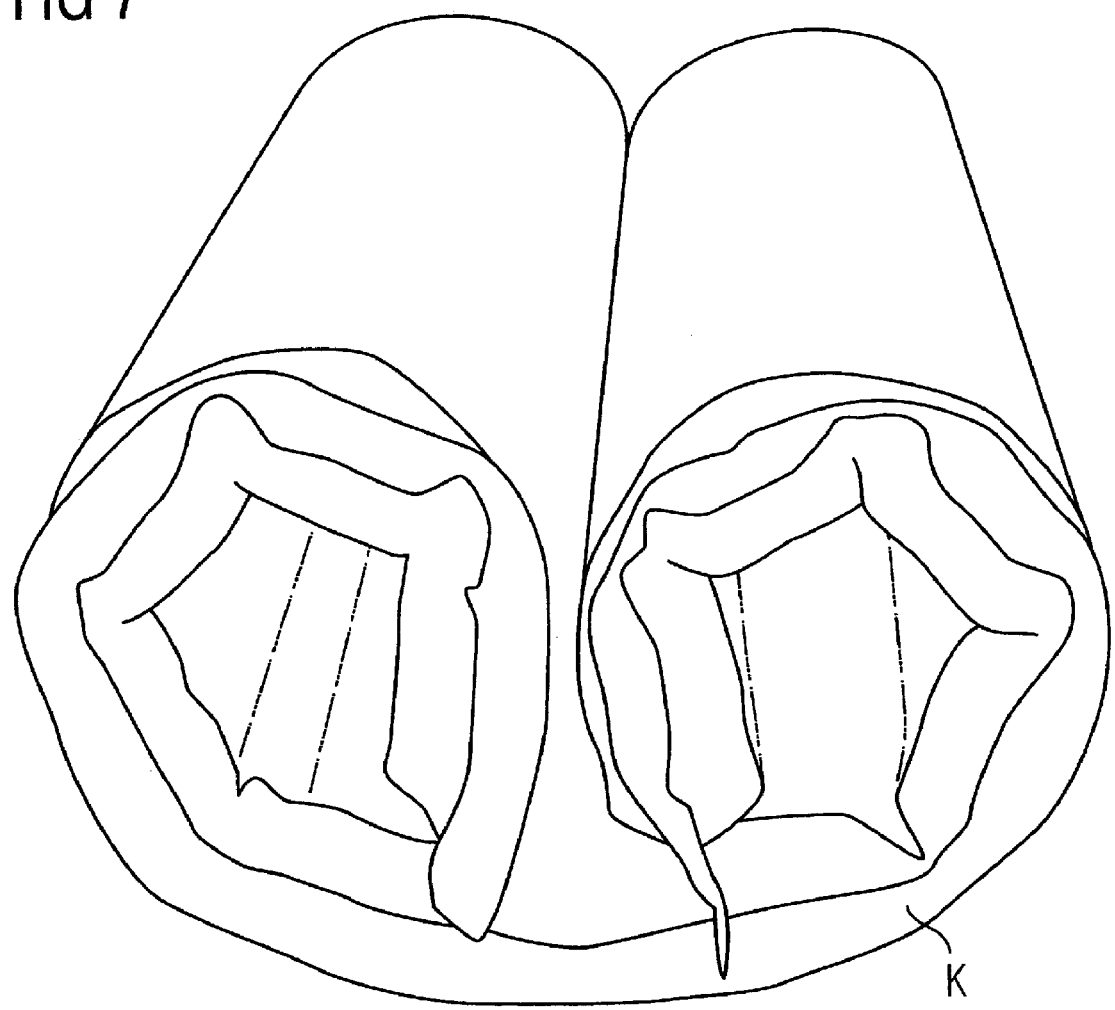

FIG. 6 and FIG. 7 show further achievable cross-section shapes of the cushion K.

Figure 3:
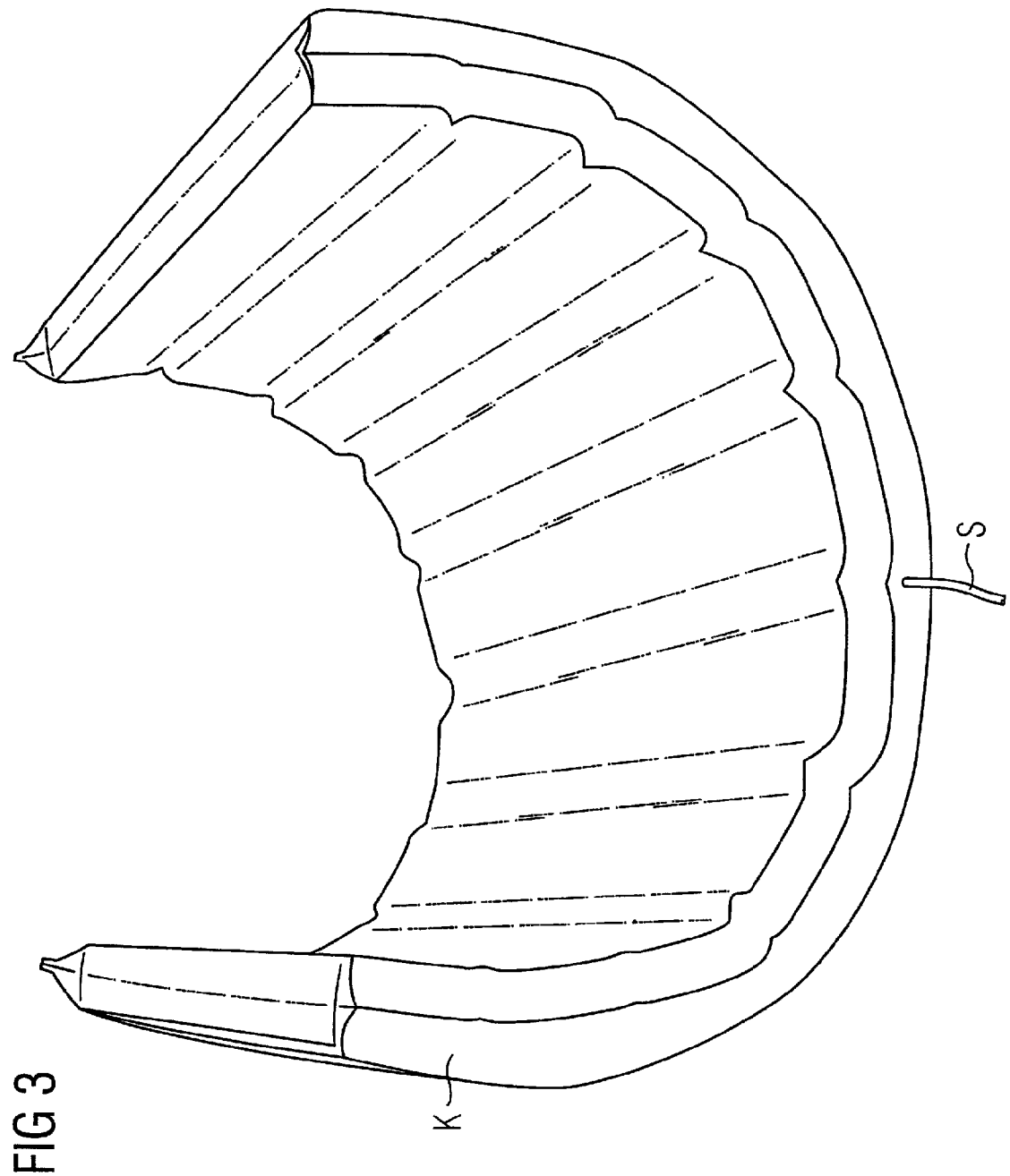
Figure 4:
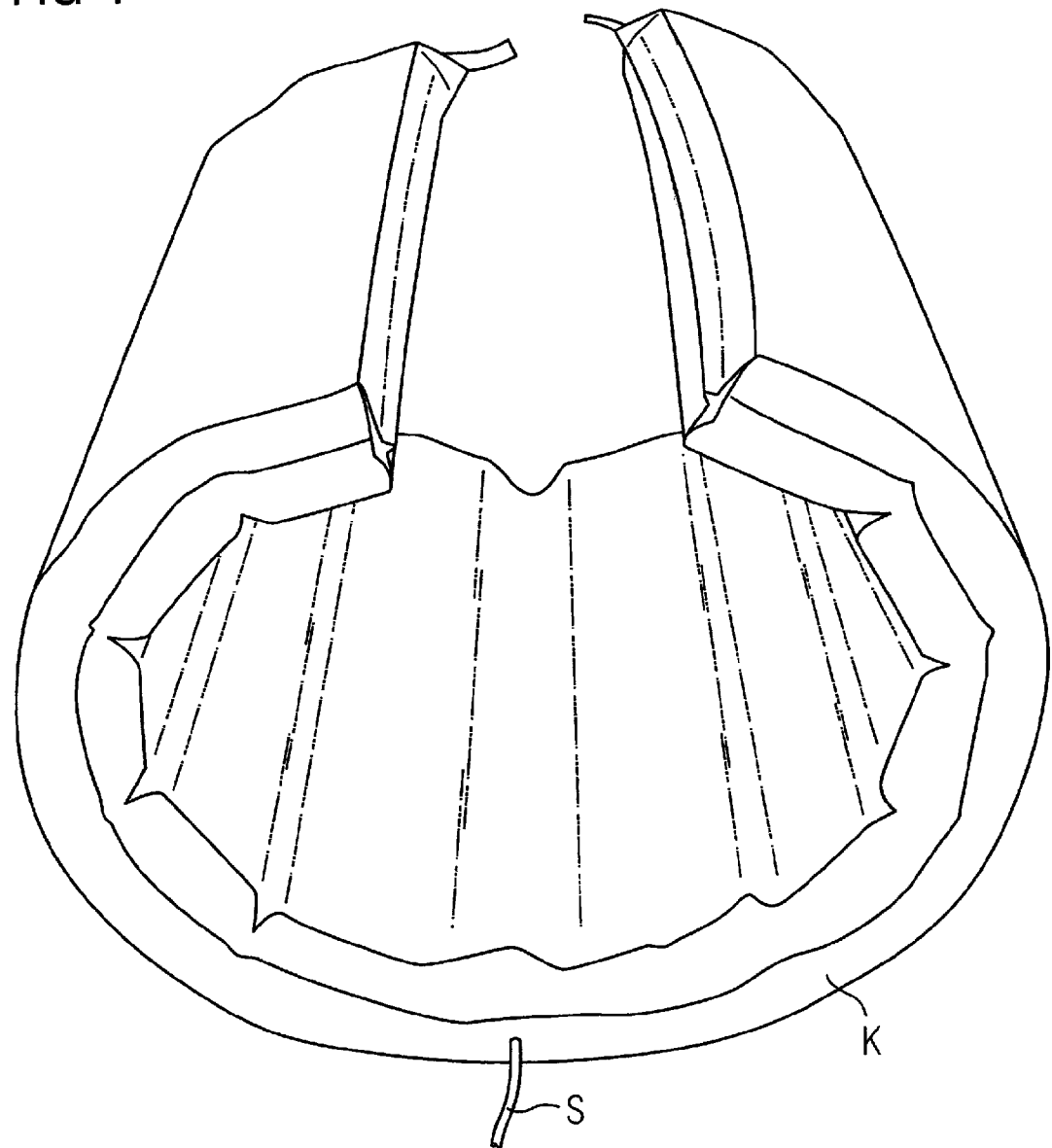

While the cushion shapes of FIG. 3 through FIG. 5 can be used for chest examinations, for example, legs of a patient could now be examined with the cushion shapes of FIG. 6 and FIG. 7 without having to exchange the unit formed by the cushion K and the local coil.

In summary, in the present invention an automatic molding of the cushion K and therefore the local coil or the local coils to selected body points of a patient is realized by evacuation or suction of air from the cushion K or the filling of gas into the cushion K.

Instead of environmental air as the gas in the cushion K, any arbitrary compressible medium or gas can be used.

Designs of the cushion are also possible that cause a shape change of the cushion K given a pressure increase inside the cushion K.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for attaching a local coil to a patient for a magnetic resonance examination, comprising:
at least one local coil configured to emit or receive signals for implementing a magnetic resonance examination;
a support device to which said at least one local coil is at least temporarily attachable, to place said at least one local coil on a patient to implement said magnetic resonance examination, said support device comprising a gas-filled cushion that changes shape dependent on gas pressure therein; and
said gas-filled cushion comprising a device operable to change said gas pressure therein to cause, as a result of the change in gas pressure, said at least one local coil to be pressed on the patient due to the change in shape of the cushion caused by said gas pressure change.

2. An arrangement as claimed in claim 1 wherein said cushion comprises a base plate and a layer of air-impermeable hard foam bonded to said base plate, said hard foam comprising recesses, and an air-impermeable soft foam at least partially filling said recesses.

3. An arrangement as claimed in claim 2 wherein said base plate is a flexible plastic plate.

4. An arrangement as claimed in claim 2 wherein said base plate is adhesively bonded to said air-impermeable hard foam.

5. An arrangement as claimed in claim 2 wherein said base plate, said hard foam and said soft foam form an insertion unit, and wherein said cushion comprises an air-impermeable casing in which said insertion unit is inserted, said air-impermeable casing being sealed so as to be air-tight after insertion of said insertion unit therein.

6. An arrangement as claimed in claim 5 wherein said casing comprises said device for changing gas pressure.

7. An arrangement as claimed in claim 6 wherein said device for changing gas pressure is selected from the group consisting of a tube and a valve.

8. An arrangement as claimed in claim 1 wherein said at least one local coil is comprised of material allowing said local coil to be flexibly shaped.

9. An arrangement as claimed in claim 1 wherein said at least one local coil is attached to said cushion by being formed as an integrated part of the cushion.

10. An arrangement as claimed in claim 1 wherein said at least one local coil is attached to the cushion by being received in a pocket-like recess in said cushion.

11. An arrangement as claimed in claim 1 wherein said at least one local coil is attached to said cushion by a hook-and-loop fastener.

12. An arrangement as claimed in claim 1 wherein said cushion is configured as an integrated, fixed component of a magnetic resonance apparatus.

13. An arrangement as claimed in claim 1 wherein said cushion is filled with environmental air as said gas.

14. A method for attaching a local coil to a patient for a magnetic resonance examination, comprising the steps of:
providing at least one local coil configured to emit or receive signals for implementing a magnetic resonance examination;
at least temporarily attaching said at least one local coil to a support device to place said at least one local coil on a patient to implement said magnetic resonance examination, said support device comprising a gas-filled cushion that changes shape dependent on gas pressure therein; and
changing said gas pressure in said gas-filled cushion to cause, as a result of the change in gas pressure, said at least one local coil to be pressed on the patient due to the change in shape of the cushion caused by said gas pressure change.

15. A method as claimed in claim 14 comprising forming said cushion from a base plate and a layer of air-impermeable hard foam bonded to said base plate, said hard foam comprising recesses, and an air-impermeable soft foam at least partially filling said recesses.

16. A method as claimed in claim 15 comprising forming said base plate as a flexible plastic plate.

17. A method as claimed in claim 15 comprising adhesively bonding said base plate to said air-impermeable hard foam.

18. A method as claimed in claim 15 comprising forming said base plate, said hard foam and said soft foam as an insertion unit, and wherein said cushion comprises an air-impermeable casing and inserting said insertion unit into said air-impermeable casing and sealing, said air-impermeable casing so as to be air-tight after insertion of said insertion unit therein.

19. A method as claimed in claim 18 comprising embodying said device for changing gas pressure in said casing.

20. A method as claimed in claim 19 comprising selecting said device for changing gas pressure from the group consisting of a tube and a valve.

21. A method as claimed in claim 14 comprising forming said at least one local coil of material allowing said local coil to be flexibly shaped.

22. A method as claimed in claim 14 comprising attaching said at least one local coil with said cushion by forming said at least one local coil as an integrated part of the cushion.

23. A method as claimed in claim 14 comprising attaching said at least one local coil to the cushion by inserting said at least one local coil in a pocket-like recess in said cushion.

24. A method as claimed in claim 14 comprising attaching said at least one local coil to said cushion by hook-and-loop fastener.

25. A method as claimed in claim 14 comprising configuring said cushion as an integrated, fixed component of a magnetic resonance apparatus.

26. A method as claimed in claim 14 comprising filling said cushion with environmental air as said gas.

\* \* \* \* \*